(12) United States Patent
Hashimoto

(10) Patent No.: US 7,592,645 B2
(45) Date of Patent: Sep. 22, 2009

(54) PHOTOELECTRIC CONVERSION DEVICE AND METHOD FOR PRODUCING PHOTOELECTRIC CONVERSION DEVICE

(75) Inventor: Sakae Hashimoto, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 490 days.

(21) Appl. No.: 11/275,028

(22) Filed: Dec. 2, 2005

(65) Prior Publication Data

US 2006/0138577 A1   Jun. 29, 2006

(30) Foreign Application Priority Data

Dec. 8, 2004   (JP)   .............................. 2004-355364

(51) Int. Cl.
*H01L 31/0328* (2006.01)
(52) U.S. Cl. ..................... 257/184; 257/222; 257/258; 257/291; 257/E31.058
(58) Field of Classification Search ................. 257/184, 257/222, 258, 291
See application file for complete search history.

(56) References Cited

U.S. PATENT DOCUMENTS

| | | | |
|---|---|---|---|
| 4,731,665 A | 3/1988 | Hashimoto et al. | 358/213.27 |
| 4,816,910 A | 3/1989 | Hashimoto et al. | 358/213.27 |
| 4,959,723 A | 9/1990 | Hashimoto | 358/213.11 |
| 4,962,412 A | 10/1990 | Shinohara et al. | 357/30 |
| 5,051,831 A | 9/1991 | Hashimoto | 358/213.11 |
| 5,060,042 A | 10/1991 | Shinohara et al. | 357/30 |
| 5,146,339 A | 9/1992 | Shinohara et al. | 358/212 |
| 5,283,428 A | 2/1994 | Morishita et al. | 250/214.1 |
| 6,969,899 B2 * | 11/2005 | Yaung et al. | 257/436 |
| 7,019,373 B2 | 3/2006 | Hashimoto | 257/432 |
| 2004/0140564 A1 * | 7/2004 | Lee et al. | 257/758 |
| 2006/0038209 A1 | 2/2006 | Hashimoto | 257/294 |
| 2006/0172450 A1 | 8/2006 | Tazoe et al. | 438/57 |

FOREIGN PATENT DOCUMENTS

JP   2000-150845   5/2000

* cited by examiner

*Primary Examiner*—Wai-Sing Louie
(74) *Attorney, Agent, or Firm*—Fitzpatrick, Cella, Harper & Scinto

(57) ABSTRACT

A photoelectric conversion device according to the present invention has a plurality of photoreceiving portions provided in a substrate, an interlayer film overlying the photoreceiving portion, a large refractive index region which is provided so as to correspond to the photoreceiving portion and has a higher refractive index than the interlayer film, and a layer which is provided in between the photoreceiving portion and the large refractive index region, and has a lower etching rate than the interlayer film, wherein the layer of the lower etching rate is formed so as to cover at least the whole surface of the photoreceiving portion. In addition, the layer of the lower etching rate has a refractive index in between the refractive indices of the large refractive index region and the substrate. Such a configuration can provide the photoelectric conversion device which inhibits the lowering of the sensitivity and the variation of the sensitivity among picture elements.

18 Claims, 7 Drawing Sheets

PHOTOELECTRIC CONVERSION DEVICE AND METHOD FOR PRODUCING PHOTOELECTRIC CONVERSION DEVICE

BACKGROUND OF THE INVENTION

1. Field of the Invention

The present invention relates to a photoelectric conversion device used in a digital camera or the like, which forms an image by converting incident light to an electric charge.

2. Related Background Art

For an image input device like a digital camera, a video camera and an image reader, a photoelectric conversion device is used such as a CCD (Charge Coupled Device) image sensor, or a non-CCD image sensor like a bipolar transistor image sensor, a field-effect transistor image sensor, a CMOS (Complementary Metal Oxide Semiconductor) image sensor and the like. The photoelectric conversion device converts optical image information to an electric signal, and the image input device processes these various converted electric signals to display them on a display for indication or record them in a storage medium.

In order to acquire high performance, a photoelectric conversion device is desired to increase the number of photoelectric conversion elements to be arranged thereon, by reducing the area (picture element area) of a photoreceiving region of the photoelectric conversion element, and to reduce its chip size. Such a photoelectric conversion device has a microlens arranged on a photo diode. The structure is designed so that the focal position is set in the vicinity of a photoreceiving portion of the photo diode.

However, as picture elements are compacted and a tip is downsized, a smaller proportion of a light condensed by a microlens enters a photoreceiving portion. As a result, a photoelectric conversion device causes the lowering of its sensitivity. Particularly when the photoelectric conversion device has taken a low F number (the aperture is fully opened), or when a camera or the like has been designed to have a short focal length between a lens and the photoreceiving portion, the problem becomes remarkable in a peripheral region of in a pixel region.

In recent years, as a method for solving such a problem, Japanese Patent Application Laid-Open No. 2000-150845 proposes a photoelectric conversion device having a optical wave-guide. FIG. 4 is a typical sectional view showing one configuration example of a conventional photoelectric conversion device. The conventional configuration will be now briefly described with reference to FIG. 4.

In the configuration shown in FIG. 4, an interlayer insulation layer 7 having a well structure 21 is formed right above a photoreceiving portion 2. The well structure 21 has a large refractive index layer 8 consisting of a material having a large refractive index than the interlayer insulation layer 7, and reflects incident light 15 which has passed through the on-chip-microlens 11, on an interface between the large refractive index layer 8 and the interlayer insulation film 7. Thus, a conventional photoelectric conversion device increases condensing efficiency and enhances sensitivity. Here, the conventional photoelectric conversion device has an etching-stop layer 12 thereon, in order not to damage the photoreceiving portion 2 and improve the uniformity of an etching depth when the well structure 21 is formed.

However, the etching-stop layer 12 occasionally causes the reflection of the light coming from the upper part on the interface between a large refractive index layer 8 and itself, due to a difference of the refractive index between them. The reflection on the interface causes reduction and variation in sensitivity. In addition, Japanese Patent Application Laid-Open No. 2000-150845 proposes a photoelectric conversion device having a patterned etching-stop layer 12 arranged on one part of a photoreceiving portion. In such a configuration, a region of the photoreceiving portion having the etching-stop layer 12 provided thereon shows reflectance different from that on the region having no film thereon, because the regions have different refractive indices; and particularly, the edge part of the etching-stop layer 12 reflects incident light thereon to decrease condensing efficiency.

In order to solve the above described problem, the present invention is directed at providing a photoelectric conversion device which inhibits sensitivity from lowering and varying, and providing a production method therefor.

SUMMARY OF THE INVENTION

A photoelectric conversion device according to the present invention for achieving the above described object has a plurality of photoreceiving portions provided in a substrate, an interlayer film overlying the photoreceiving portions, a large refractive index region which is provided so as to correspond to the photoreceiving portion and a higher refractive index than the interlayer film, and a layer which is provided between the photoreceiving portion and the large refractive index region, and has a lower etching rate than the interlayer film has, wherein the refractive index of the layer of the lower etching rate is between the refractive indices of the large refractive index region and the substrate, and the layer of the lower etching rate is formed so as to cover at least the whole surface of the photoreceiving portion.

The above described configuration can enhance condensing efficiency because of having a large refractive index region on a photoreceiving portion, and can reduce the reflection of incident light on the surface of the photoreceiving portion because of having the above configured layer of a lower etching rate.

Another photoelectric conversion device according to the present invention has a plurality of photoreceiving portions provided in the substrate, a transfer transistor for transferring the signal charge of the photoreceiving portion, an interlayer film overlying the photoreceiving portions, a large refractive index region which is provided so as to correspond to the photoreceiving portion, and has a higher refractive index than the interlayer film, and a layer which is provided in between the photoreceiving portion and the large refractive index region, and has a lower etching rate than the interlayer film, wherein the layer of the lower etching rate is arranged so as to cover at least the whole surface of the photoreceiving portion, and cover at least a part of a gate electrode of the transistor.

Such a configuration can enhance condensing efficiency because of having a large refractive index region on a photoreceiving portion; can also reduce damage to the photoreceiving portion, and the damage to the gate electrode both occurring in the procedure of producing a photoelectric conversion device, which is preferable for reducing a dark current flowing in the device, for example.

Another photoelectric conversion device according to the present invention has a plurality of photoreceiving portions provided in the substrate, an interlayer film overlying the photoreceiving portions, a large refractive index region which is provided so as to correspond to the photoreceiving portion and has a higher refractive index than the interlayer film, a layer which is provided in between the photoreceiving portion and the large refractive index region, and has a lower etching rate than the interlayer film, and an element isolation region arranged among a plurality of the photoreceiving portions, wherein the layer of the lower etching rate is arranged so as to cover at least the whole surface of the photoreceiving portion, and cover at least of a part of the element isolation region.

A photoelectric conversion device having such a configuration can increase condensing efficiency because of having a large refractive index region on a photoreceiving portion; and can reduce the damage to the photoreceiving portion and the damage to an element isolation region occurring in the procedure of producing the device.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1:
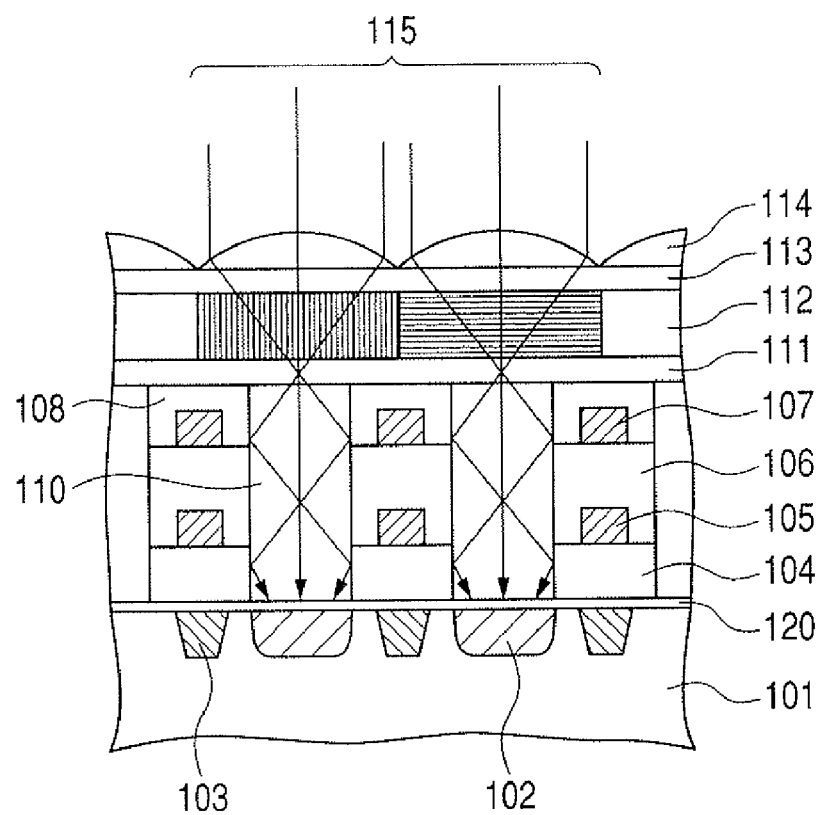
FIG. 1 is a typical sectional view showing one configuration example of a photoelectric conversion device according to a first embodiment of the present invention.

Embodiments according to the present invention will be now described with reference to the drawings. FIG. 1 is a typical sectional view showing one configuration example of a photoelectric conversion t device according to a first embodiment.

As is shown in FIG. 1, a photoelectric conversion device has a plurality of photoreceiving portions 102 formed at regions across a predetermined depth from the surface, in a semiconductor substrate 101; element isolation regions 103 provided in between the adjacent photoreceiving portions; an etching-stop layer 120 of a layer having a lower etching rate than an upper layer has, formed on the surface of a semiconductor substrate 101 so as to cover the whole surface of the photoreceiving portion 102; a first insulation film 104 provided on the etching-stop layer 120; and a transistor for transferring an electric charge formed around the surface of the semiconductor substrate 101, though it is not shown in the drawings. In the above configuration, the etching-stop layer 120 may be arranged on the upper part of the transistor.

A photoelectric conversion device further has a first pattern 105 and a second pattern 107 provided so as to overlie a first insulation film 104, which are electric wiring for transmitting electric signals from a photoreceiving portion 102 to the outside. As shown in FIG. 1, the first pattern 105 is formed on the first insulation film 104. The second pattern 107 is formed on the second insulation film 106 formed on the first pattern 105, so as to lie right on the first pattern 105. The second pattern 107 is covered with a protective layer 108. The first pattern 105 and the second pattern 107 are provided on the upper part of a region between the adjacent photoreceiving portions 102 and also functions as a light shielding film for preventing a light to enter each photoreceiving portion 102 from entering another photoreceiving portion 102. The first insulation film 104 and the second insulation film 106 work as an interlayer insulation film for insulating each electric wiring layer from the other.

A photoelectric conversion device further has a well-shaped opening formed in a first insulation film 104, a second insulation film 106 and a protective layer 108 so as to reach the surface of an etching-stop layer 120 on a photoreceiving portion 102 from the protective layer 108 side. The aperture is filled with a large refractive index layer made of a material having a higher refractive index than the protective layer 108 and the interlayer insulation film have. The large refractive index layer filled in the well-shaped opening is flattened to form a large refractive index region 110.

A photoelectric conversion device also has a color filter layer 112 provided on a protective layer 108 through the first flattened layer 111, and a microlens 114 further provided on the color filter layer 112 through the second flattened layer 113.

In a photoelectric conversion device according to the present embodiment, an etching-stop layer 120 having a refractive index in between a large refractive index region 110 and the semiconductor substrate 101 covers the whole surface of a photoreceiving portion 102. As a result, the photoelectric conversion device allows the light which should have reflected on the end of the etching-stop layer 120 in a conventional photoelectric conversion device that has the etching-stop layer 120 formed on one part of the surface of the photoreceiving portion, into the photoreceiving portion 102, improves condensing efficiency and inhibits its sensitivity from varying. In other words, such an etching-stop layer 120 having such a refractive index can reduce reflectance on those interfaces. Further, it is enabled to take in the light output to outside of the high refractive index region by exceeded total reflective angles in the interface of the high refractive index region and the interlayer insulation film. Moreover it is enabled to also take in the light which not have input putting in the high refractive index region directly. Moreover it is enabled to also take in the light which is incident in the high refractive index region but in an outside of a total reflection region at an interface between the high refractive index region and the an interlayer insulating layer. Moreover it is enabled to also take in the light which is incident indirectly in the high refractive index region.

A photoelectric conversion device also makes the light (incident light 115 shown in FIG. 1) which has entered a large refractive index region 110 through the microlens 114 from the outside reflect on the side wall of the large refractive index region and introduces it into a photoreceiving portion 102, because the large refractive index region 110 has a higher refractive index than a protective layer 108 and an interlayer insulation film have. Thus, the large refractive index region 110 in a well-shaped opening plays a role as an optical waveguide, and can efficiently lead the light condensed by the microlens 114 into the photoreceiving portion 102. As a result of this, the photoelectric conversion device can attain high sensitivity, even when having a low F value or a short focal distance between the lens and the photoreceiving portion.

In the next place, a method for producing a photoelectric conversion device shown in FIG. 1 will be described with reference to FIGS. 2A to 2I.

Figure 2A:
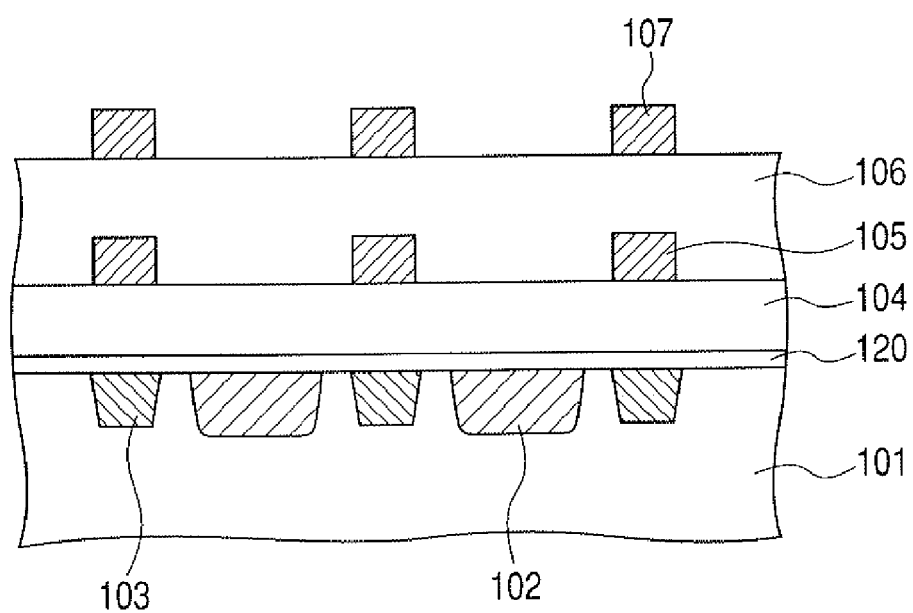
FIG. 2A is a view for describing a process of producing a photoelectric conversion device shown in FIG. 1.

A photoelectric conversion device is produced by the steps of: at first, preparing a semiconductor substrate 101 made of a silicon wafer or the like, as shown in FIG. 2A; forming an element isolation region 103 in the inner part around the surface of the semiconductor substrate 101, by using a STI (shallow trench isolation) technique; subsequently, forming a diffusion layer to become a photoreceiving portion 102 of a photo diode and a diffusion layer of a source electrode and a drain electrode of the transistor which is not shown in the figures, across a region reaching the inside of the substrate from the surface of the semiconductor substrate 101, through forming a photoresist pattern on the semiconductor substrate 101, and performing ion implantation and heat treatment; and then, forming a gate insulation film and a gate electrode of the transistor, which are not shown in the figures, in a similar process to the conventional one. In the above steps, the semiconductor substrate 101 may have at least of a natural oxide film and a part of the gate insulating film are formed on the surface, though it is not shown in the figures. However, the natural oxide film is sufficiently thinner than a wavelength of light, so that the interfaces almost do not reflect light. Subsequently, an etching-stop layer 120 is formed with a CVD (vapor deposition) method or the like. Here, the etching-stop layer 120 is formed of SiN with a LP (low pressure)-CVD method. In the step, the layer of SiN is formed so as to occupy a larger area at least than the surface of the photoreceiving portion. Subsequently, the first insulation film 104 is formed on the etching-stop layer 120 with the CVD method or the like. Here, it is recommended to flatten the surface of the first insulation film 104 with a CMP (chemical-mechanical polishing) method, so that patterning precision can be improved in the subsequent step.

A photoelectric conversion device is subsequently produced by the steps of: forming a metallic film made of Al, Mo, W, Ta, Ti or Cu or an alloy mainly containing them, on the first insulation film 104, with a sputtering method, a CVD method, an electrolytic plating method or the like; after that, forming the first pattern 105 into a desired shape, by removing the metallic film of a part locating above a photoreceiving portion 102 with a lithography process and an etching process;

then, forming the second insulation film 106 made of SiO or a material mainly containing it on the first insulation film 104 and the first pattern 105 with the CVD method; flattening the top surface of the second insulation film 106 with the CMP method; next, forming a metallic film made of Al, Mo, W, Ta, Ti or Cu or an alloy mainly containing them similarly to the first pattern 105, on the second insulation film 106 with a sputtering method, a CVD method, an electrolytic plating method or the like; and forming the second pattern 107 into a desired shape, by removing a part locating above the photoreceiving portion 102 with the lithography process and the etching process.

Figure 2B:
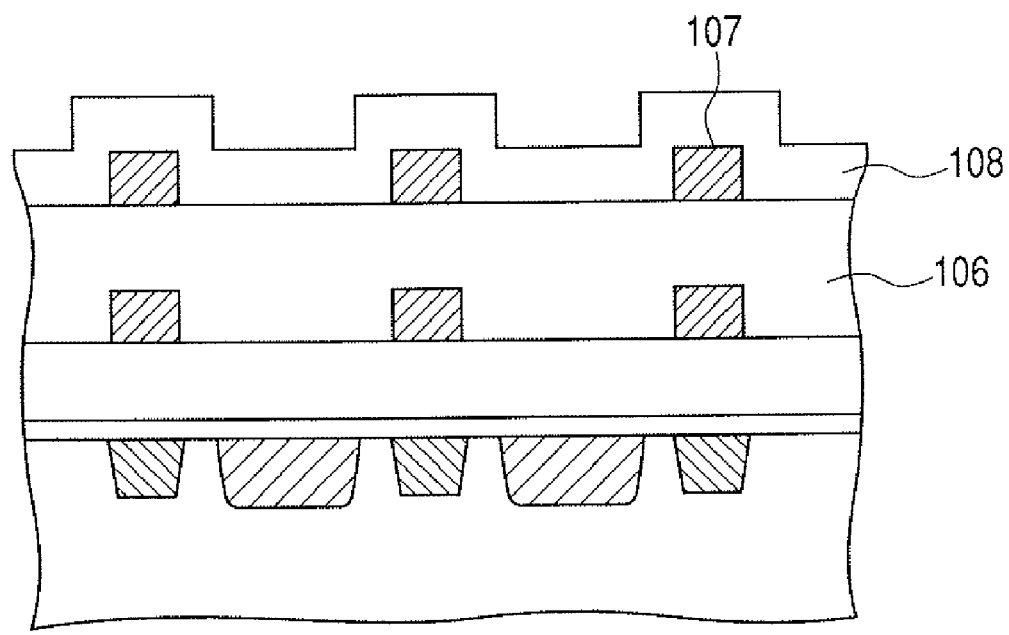
FIG. 2B is a view for describing a process of producing a photoelectric conversion device shown in FIG. 1.
Figure 2C:
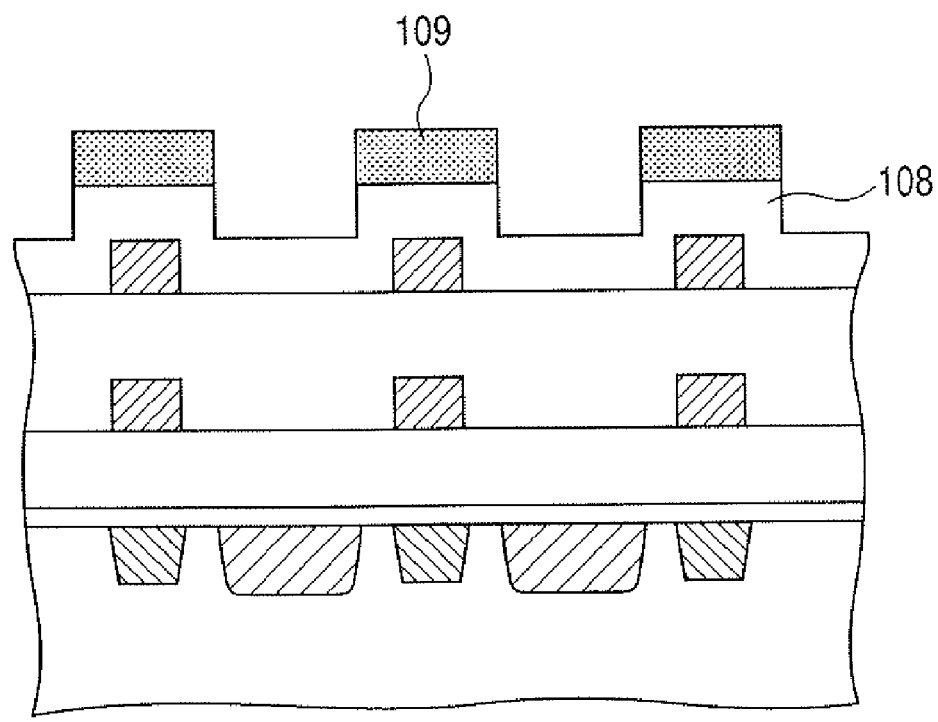
FIG. 2C is a view for describing a process of producing a photoelectric conversion device shown in FIG. 1.

A photoelectric conversion device is further subsequently produced by the steps of: forming a protective layer 108 having an insulation film such as a SiN film, a SiON film and a SiO film on the second pattern 107 and the second insulation film 106 with a CVD method, as shown in FIG. 2B; and then, forming a photoresist pattern 109 which works as an etching mask for opening a part right above a photoreceiving portion 102, on the protective layer 108, as shown in FIG. 2C.

Figure 2D:
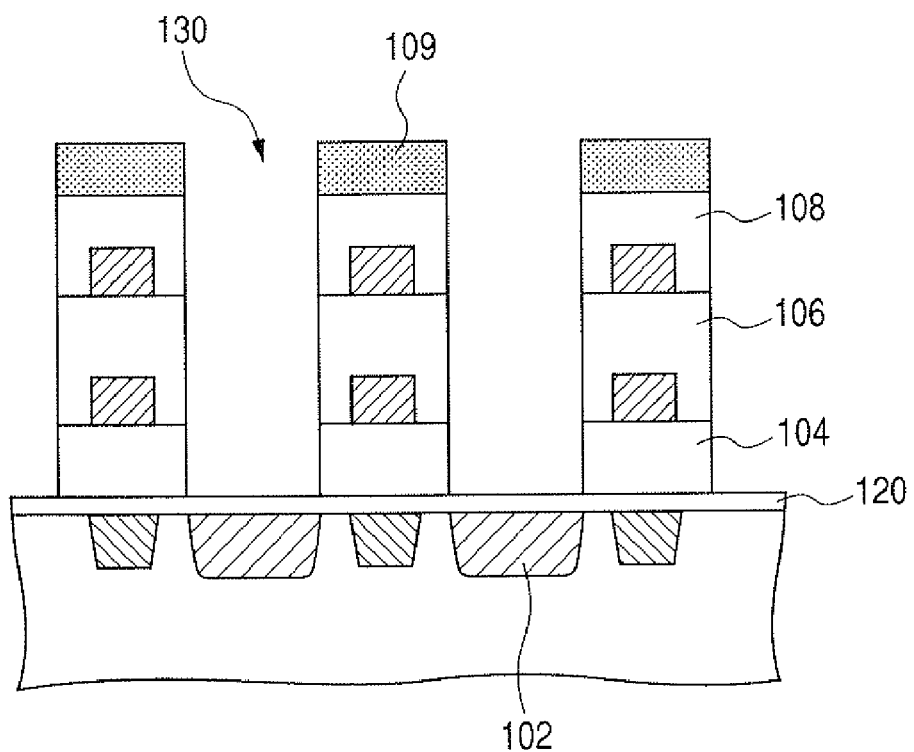
FIG. 2D is a view for describing a process of producing a photoelectric conversion device shown in FIG. 1.

Then, those layers are anisotropically etched toward a photoreceiving portion 102 by using the photoresist pattern 109 as an etching mask, as shown in FIG. 2D. When the etched part reaches an etching-stop layer 120, an etching rate decreases. At this time, etching is stopped. Thus, a well-shaped opening 130 is arranged so as to penetrate and the multilayered insulation film consisting of a protective layer 108, the second insulation film 106 and the first insulation film 104. In the etching step, each insulation film of the multilayered insulation film is etched in an optimal etching condition for removing each film. The etching condition which is adopted at least in a stage when the etched part reaches the etching-stop layer 120 needs to have a sufficiently high selective etching ratio of the first insulation film 104 to the etching-stop layer 120 (=the etching rate of the first insulation film 104/the etching rate of the etching-stop layer 120). Namely, the etching-stop layer 120 shall have a lower etching rate than the first insulation film 104 has.

By the way, an etching-stop layer 120 has only to be formed so as to cover at least the whole surface of a photoreceiving portion, and needs not to be formed on other parts, unless required. However, it is preferable to form the etching-stop layer 120 so as to cover at least a part of the gate electrode of a transistor (not shown) for transferring an electric charge, because the etching-stop layer 120 reduces damage onto a gate electrode occurring in a subsequent production step, and consequently reduces a dark current passing through a photoelectric conversion device. A site which does not need to be covered with the etching-stop layer 120 is, for instance, a contact portion which is opened on the gate electrode in order to connect a gate electrode to the electric wiring of an upper layer.

It is also preferable to form an etching-stop layer 120 on at least of a part of an element isolation region 103 such as STI, similarly to the case on the gate electrode, because the etching-stop layer 120 protects the STI from being damaged in a production step of forming holes.

Figure 2E:
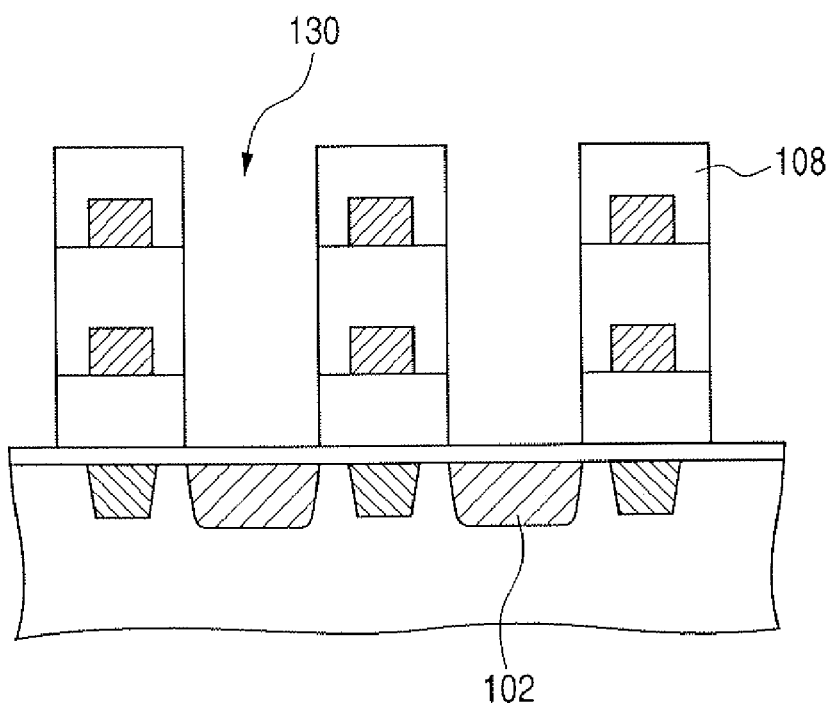
FIG. 2E is a view for describing a process of producing a photoelectric conversion device shown in FIG. 1.
Figure 2F:
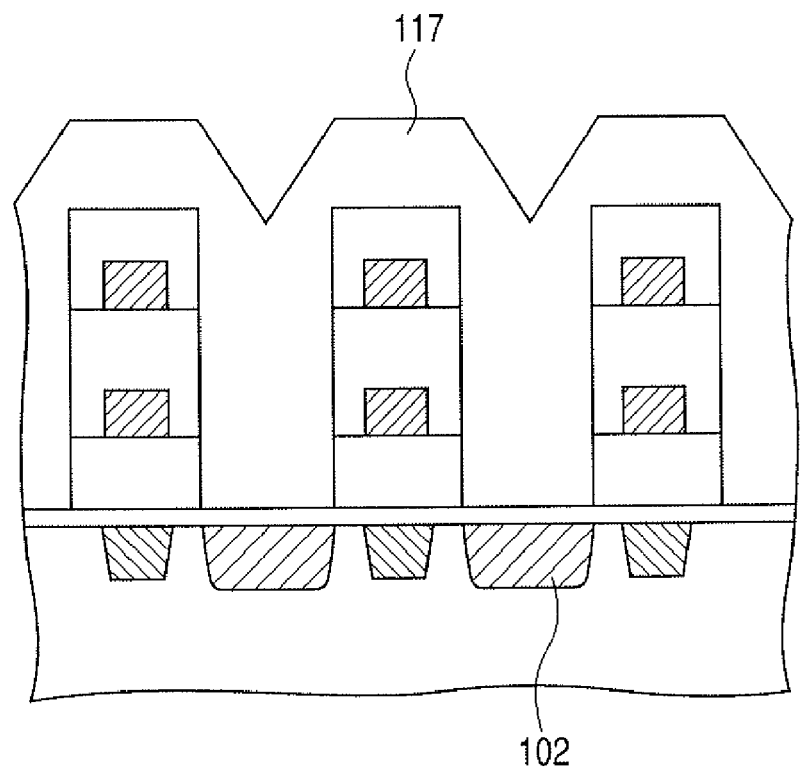
FIG. 2F is a view for describing a process of producing a photoelectric conversion device shown in FIG. 1.

Subsequently, as shown in FIG. 2E, a photoresist pattern 109 on a protective layer 108 is removed by at least one of oxygen plasma treatment and organic peeling liquid treatment. After that, a large refractive index layer 117 which becomes a large refractive index region 110 afterwards is formed on a well-shaped opening 130, with a HDP (high-density plasma)-CVD method, as shown in FIG. 2F.

Here, the refractive index of the etching-stop layer 120 is set to a similar value to that of a large refractive index region 110, or a value in between the refractive indices of a semiconductor substrate 101 and the large refractive index region 110. Thereby, the etching-stop layer can reduce the reflection of incident light onto the surface of a photoreceiving portion.

When an anti-reflection coating for reducing the reflection of the incident light onto the surface of a photoreceiving portion is formed on the surface of the photoreceiving portion of the semiconductor substrate 101, it is preferable to set the refractive index of an etching-stop layer 120 at around a value in between the refractive indices of the anti-reflection coating and a large refractive index region 110. Alternatively, the refractive index of the etching-stop layer 120 may be set to a value equal to that of the large refractive index region 110 or the anti-reflection coating.

Here, a specific example on a method for forming a large refractive index layer 117 will be described. The example is a method, when SiN (refractive index n=1.95) is employed for an etching-stop layer 120, for filling a recess with an aperture diameter of 2 μm and an aperture depth of 3.5 μm with the same material SiN as is used in the etching-stop layer 120, with a high-density plasma CVD method.

In general, when a photoreceiving portion 102 is etched with a dry etching process, the process may increase a dark current and a pixel defect of a photoelectric conversion device, due to the plasma damage. Particularly, when even a region very close to the photoreceiving portion 102 is etched as in the case of the present embodiment, the influence of the plasma increases. For this reason, in the first step, a SiN film is formed into the thickness of about 5,000 angstroms, in a damage-relaxing film-forming condition 1 which has reduced a RF bias to 0 to 400 W and controlled other conditions to the followings: [gas mass flow: Ar: 200 sccm, N2: 135 sccm, SiH4: 19 sccm, pressure: 8 mTorr, RF power: 3,000 W, RF bias power: 300 W and film-forming time: 5 min].

Subsequently, the SiN film is formed into the thickness of about 2 μm in the following film-forming condition 2 to fill a well-shaped opening: [gas mass flow: Ar: 126 sccm, N2: 360 sccm, SiH4: 84 sccm, pressure: 8 mTorr, RF power: 3,000 W, RF bias power: 3,500 W and film-forming time: 5 min].

Furthermore, the SiN film is formed into the thickness of about 1 μm in the following film-forming condition 3 to promote the flattening of the top part of the opening: [gas mass flow: Ar: 126 sccm, N2: 360 sccm, SiH4: 84 sccm, pressure: 8 mTorr, RF power: 3,000 W, RF bias power: 5,000 W and film-forming time: 2.5 min]. In the above condition, the RF bias power is increased to 5,000 W, by which a salient part is relatively more etched than a recess part is, and a part right above a photoreceiving portion is relatively flattened. As a result, in a subsequent step for flattening the surface of a SiN film, an amount of the SiN film to be removed by etching or to be polished by CMP treatment is decreased, or the step itself is eliminated, any of which is an advantage. By employing such a high-density plasma CVD method, a well-shaped opening with a high aspect ratio (=opening depth/opening diameter) can be filled with a film. In addition, by changing the RF bias power to be applied on a substrate, the damage to be given to the photoreceiving portion 102 can be reduced, and the top surface of the formed film can be flattened.

In the above embodiment, a SiN film is used for an etching-stop layer 120 and in a large refractive index region 110, but any material can be used as long as it has a higher refractive index than the first insulation film 104 and the second insulation film 106 have, and provides desired condensing efficiency. As described above, it is preferable that the etching-stop layer 120 has the refractive index similar to that of the large refractive index region 110 or in between the refractive indices of a semiconductor substrate 101 and the large refractive index region 110. Accordingly, the material for the etching-stop layer 120 is not limited to the SiN film, but may employ, for instance, a SION film (of which the refractive index can be adjusted to 1.45 to 2.0).

In addition, the same material can acquire a different refractive index by changing a production method. For instance, when using a SiN film for an etching stop layer 120 and a large refractive index layer 117, the etching-stop layer may be the SiN film formed with a low pressure CVD method, and the large refractive index layer 117 may be with a HDP-CVD method. In the above step, the SiN film formed with the HDP-CVO method tends to have lower density and a lower refractive index than those with the low pressure CVD method. Thus, by changing a production method, even the same material can acquire a desired refractive index.

In the above embodiment, the film-forming condition for filling a well-shaped opening with SiN consisted of mainly three different conditions, but the film-forming condition may be an appropriately selected single condition or combination of a plurality of conditions, as long as the condition imparts a large refractive index region made of the SiN desired condensing efficiency and basic performance as a sensor.

Figure 2G:
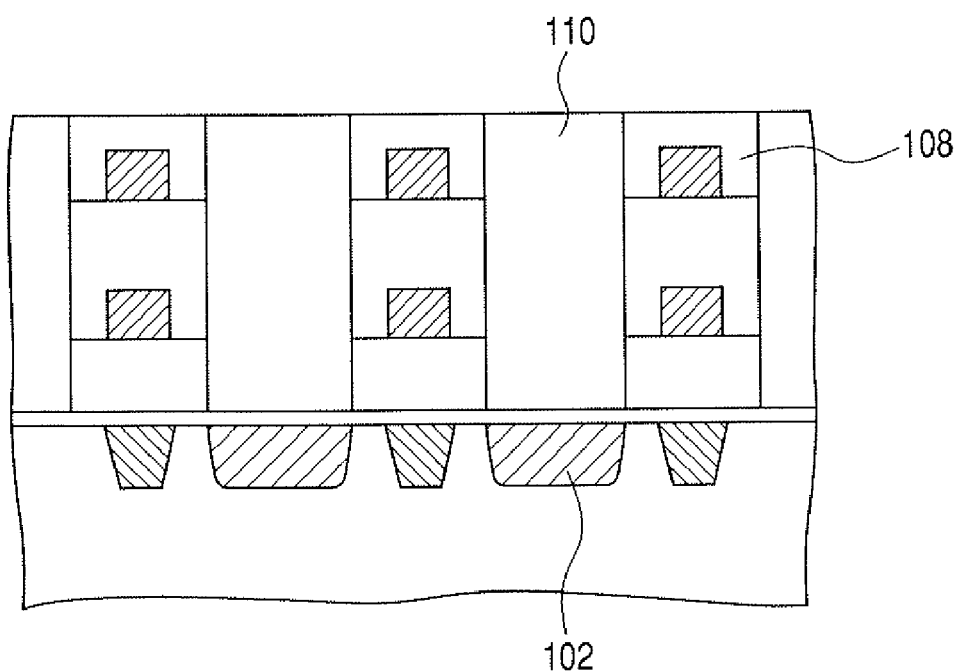
FIG. 2G is a view for describing a process of producing a photoelectric conversion device shown in FIG. 1.

Subsequently, the surface of a large refractive index layer 117 is polished with a CMP method to be flattened, and a large refractive index region 110 is formed as shown in FIG. 2G. Here, the CMP method was employed for flattening the surface, but an etching back method with the use of a plasma etching technique may be employed. In addition, the large refractive index layer 117 was polished to be flattened till the surface reaches the top face of a protective layer 108, but the polishing may be stopped when the surface is still in the large refractive index layer 117. In the above step, if the same function as in the protective layer 108 was given to the large refractive index layer 117, the step of forming the protective layer 108 described in FIG. 2B can be omitted.

Figure 2H:
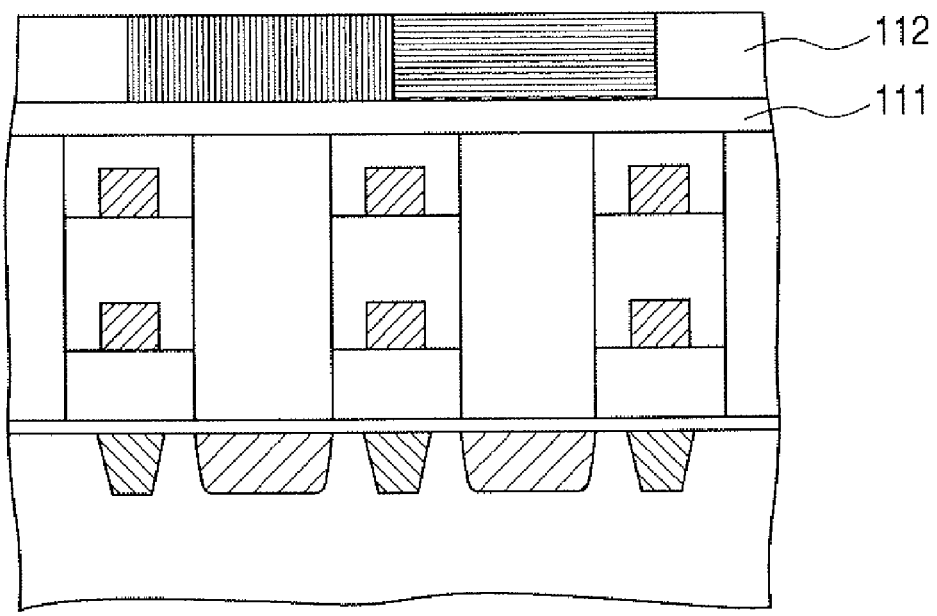
FIG. 2H is a view for describing a process of producing a photoelectric conversion device shown in FIG. 1.

After that, the first flattened layer 111 is formed with an application method as shown in FIG. 2H. Subsequently, a base material for a color filter layer 112 is applied on the first flattened layer 111, and then by light-exposing and developing the layer, a color filter layer 112 (Red layer, Green layer and Blue layer in case of primary color) is formed.

Figure 2I:
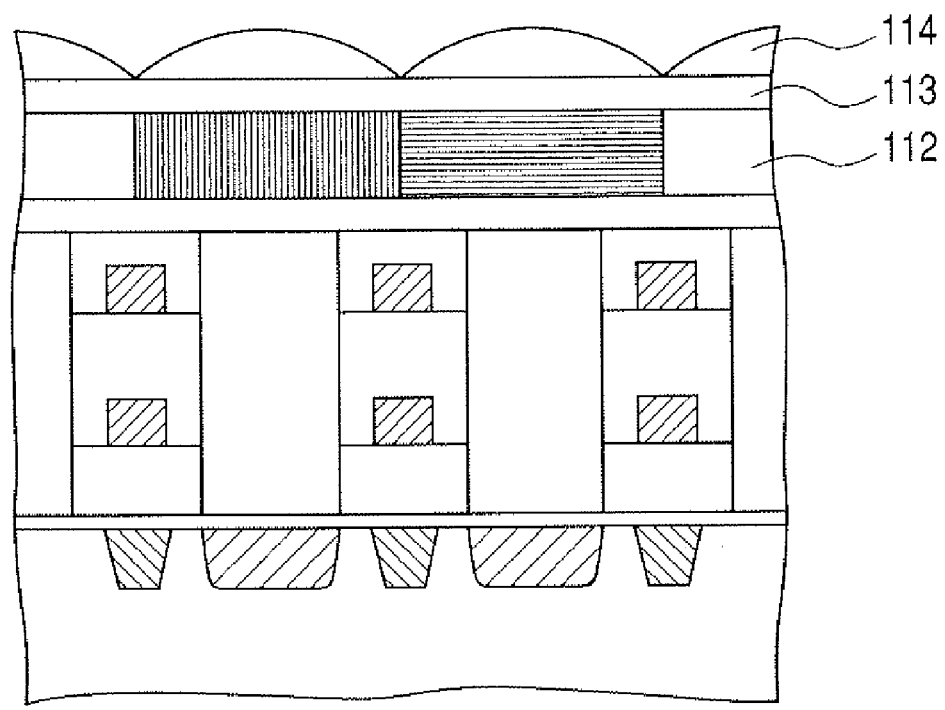
FIG. 2I is a view for describing a process of producing a photoelectric conversion device shown in FIG. 1.

Furthermore, as shown in FIG. 2I, the second flattened layer 113 is formed on the color filter layer 112 with an application method, and subsequently, the base material for a microlens 114 is applied on the second flattened layer 113. Then, the microlens 114 is formed by light-exposing and developing the material to form a predetermined pattern, and reflowing the formed pattern. By the above described steps, a photoelectric conversion device is produced.

In the method for producing a photoelectric conversion device according to the present embodiment, an etching-stop layer 120 is formed so as to cover at least the whole surface of a photoreceiving portion. As a result, when a well-shaped opening is formed for a large refractive index region 110, the opening can be not only formed closer to an area of the surface of the photoreceiving portion, but also can be prevented from penetrating into the surface of the photoreceiving portion.

The etching-stop layer 120 which covers the surface of each photoreceiving portion 102 has also preferably a wider area than that of an interface between a large refractive index region 110 and the etching-stop layer 120. Then, the etching-stop layer prevents a light refracted in the large refractive index region 110 from shining the outside of the photoreceiving portion 102, and consequently improves condensing efficiency.

In addition, in the above described embodiment, an element isolation region 103 was formed with a STI method, but it may be formed with a LOCOS method (a method of locally oxidizing silicon). In any element isolation region, as shown in each of FIGS. 1 to 2A through 2I, an etching-stop layer 120 may be arranged in the upper part. It is necessary to cover the part at least, although the whole may be covered.

In the next place, as a second embodiment, a photoelectric conversion device with no etching-stop layer 120 provided thereon will be described.

Figure 3:
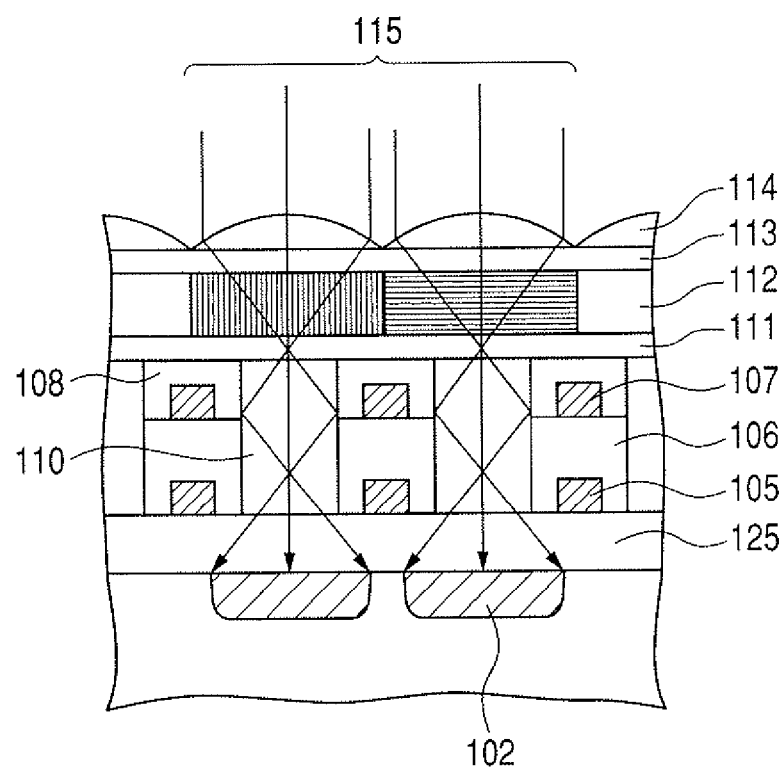
FIG. 3 is a typical sectional view showing one configuration example of a photoelectric conversion device according to a second embodiment of the present invention.
Figure 4:
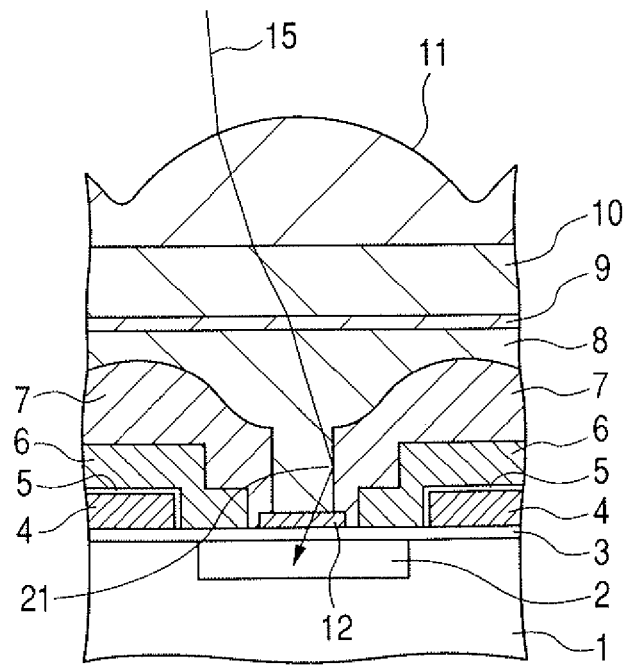
FIG. 4 is a typical sectional view showing one configuration example of a conventional photoelectric conversion device.

FIG. 3 is a typical sectional view showing one configuration example of a photoelectric conversion device according to a second embodiment. In FIG. 3, the same reference numeral as in FIG. 1 is attached for the same component as in the photoelectric conversion device shown FIG. 1, and a detailed description for the component is omitted. In addition, an element isolation region and a transistor for transferring an electric charge are not shown in the figure because of being the same as in a previous case.

A photoelectric conversion device shown in FIG. 3 has the first insulation film 125 formed on a semiconductor substrate 101 having a photoreceiving portion 102 formed therein; and sets the refractive index of the first insulation film 125 equal to that of a large refractive index region 110. In this case as well, the refractive index of the first insulation film 125 may be set to a value in between the refractive indices of the semiconductor substrate 101 and the large refractive index region 110.

A method for producing a photoelectric conversion device shown in FIG. 3 will be now briefly described.

The device is produced by the steps of: forming a photoreceiving portion 102 and a transistor (not shown) on a semiconductor substrate 101; then, forming the first insulation film 125 thereon, as was shown in FIG. 2A; subsequently, forming the first pattern 105, the second insulation film 106 and second pattern 107; after that, forming a protective layer 108 and a photoresist pattern 109 thereon with the same treatment method as in the case of FIGS. 2B and 2C; and then, forming a well-shaped opening in the protective layer 108 and the second insulation film 106, through etching the films in an etching period of time, which is controlled to be a quotient obtained by dividing the total film thickness of the protective layer 108 and the second insulation film 106 by an etching rate. In the etching process, even when an etching amount varies, the first insulation film 125 can prevent the opening from reaching the photoreceiving portion 102. After that, the above substrate is treated in a similar way to that in the case of FIG. 2E and the remainder, and a photoelectric conversion device shown in FIG. 3 is produced.

A photoelectric conversion device according to the second embodiment not only inhibits the lowering of the sensitivity and the variation of the sensitivity among picture elements but also can be etched in a freer etching condition in the etching step, because the first insulation film 125 and the second insulation film 106 are not necessarily etched in a secured selective etching ratio.

Now, as a third embodiment, a photoelectric conversion device having an etching-stop layer 120 arranged so as to cover one part of the gate electrode of a transistor for transferring an electric charge will be briefly described with reference to FIGS. 5A and 5B.

Figure 5A:
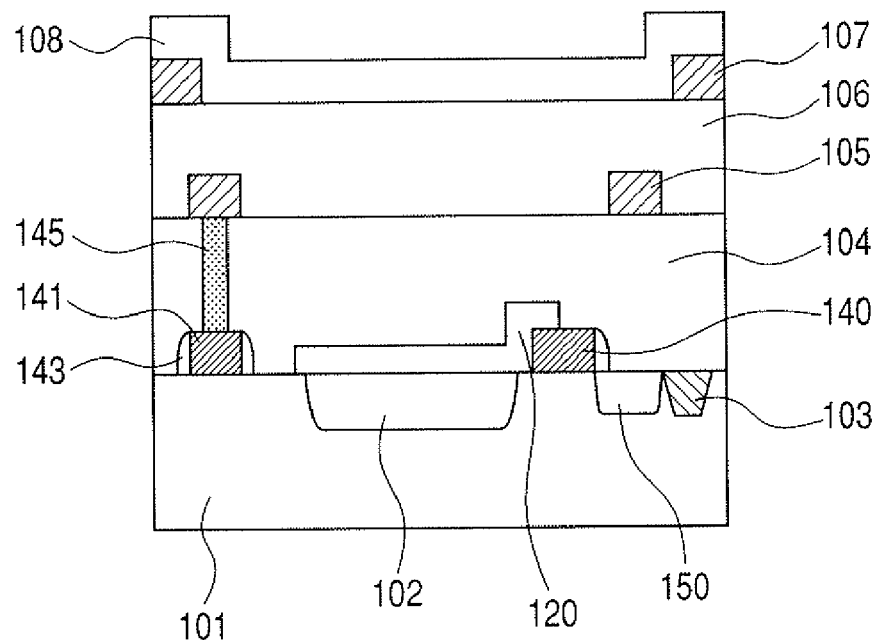
FIG. 5A is a view for describing a process of producing a photoelectric conversion device according to a third embodiment of the present invention.
Figure 5B:
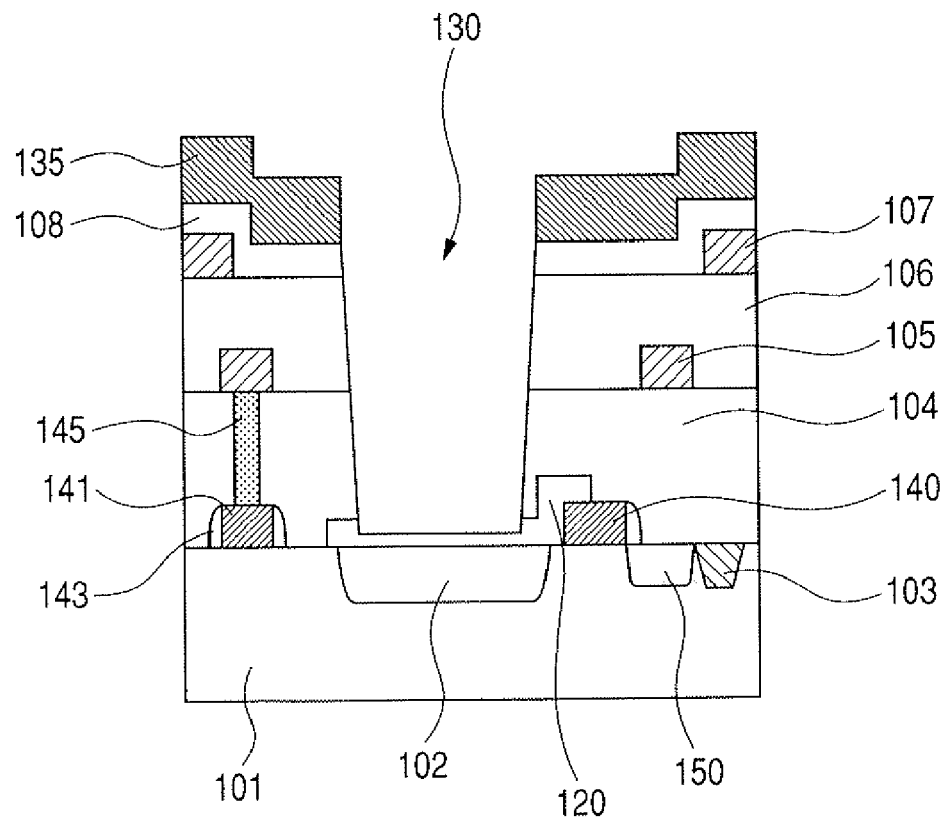
FIG. 5B is a view for describing a process of producing a photoelectric conversion device according to a third embodiment of the present invention.

Both FIGS. 5A and 5B are typical sectional views showing one configuration example of a photoelectric conversion device, and showing the production steps therefor. In FIGS. 5A and 5B, the same reference numeral as in FIG. 1 is attached for the same component as in the photoelectric conversion device shown FIG. 1, and detailed description for the component is omitted.

In FIG. 5A, a gate electrode 140 of a transistor for transferring an electric charge is arranged in the vicinity of the surface of the semiconductor substrate 101, and of the diffusion region 150 of the transistor formed in the substrate. In addition, a contact portion 145 for electrical conduction is formed on the gate electrode 141 of another transistor. Here, each gate electrode has a side wall 143.

In addition, an etching-stop layer 120 is arranged on a photoreceiving portion 102, so as to cover a wider area than that of the photoreceiving portion 102, and further is arranged so as to cover one part of the gate electrode 140 of the transistor for transferring an electric charge, in the present embodiment. Here, the previously described side wall 143 and the etching-stop layer 120 are formed through etching the same layer. Those two components can be easily formed because of being formed from the same layer.

FIG. 5B is a typical sectional view of a photoelectric conversion device according to the present embodiment, which has been produced by patterning a resist mask 135 on a protective layer 108 in FIG. 5A, and etching the above layers for preparing a well-shaped opening 130. Afterwards, the well-shaped opening is filled with a material having a higher refractive index than the first insulation layer 104 and the second insulation layers 106 have and capable of providing desired condensing efficiency; then the surface is flattened; and thus, a large refractive index region 110 is formed.

In the above configuration where an etching-stop layer 120 is formed so as to cover one part of the gate electrode 140 for transferring an electric charge, the etching-stop layer 120 reduces damage to the gate electrode 140 given in a subsequent step. The step of giving the damage to the gate electrode 140 includes the step of HDP-CVD for filling a well-shaped opening 130 with the large refractive index material, and the step of ion-implantation when forming a diffusion region in the periphery. The above configuration reduces the damage due to those steps, and as a result, can reduce a dark current of the photoelectric conversion device.

As described above, an etching-stop layer 120 has only to cover one part of a gate electrode 140 for transferring an electric charge, and accordingly may cover the whole surface thereof. If necessary, a part of a contact portion 145, for instance, may be removed.

The etching-stop layer 120 may cover further at least of a part of an element isolation region. Then, it can inhibit the element isolation region from being damaged in production steps.

In addition, the refractive index of an etching-stop layer 120 according to the present embodiment may be adjusted to the same value as in a large refractive index region 110, or a value in between the refractive indices of a semiconductor substrate 101 and the large refractive index region 110, though it is not specified in the present embodiment. When having such a refractive index, the etching-stop layer 120 can further inhibit reflection at the interfaces thereof from occurring on a photoreceiving portion.

Up to this point, the present invention has been described in detail. However, the present invention is not limited to the above described embodiment, but an appropriate combination of a refractive index of an etching stop layer with the arrangement thereof and the like can be employed.

This application claims priority from Japanese Patent Application No. 2004-355364 filed Dec. 8, 2004, which is hereby incorporated by reference herein.

What is claimed is:

1. A photoelectric conversion device comprising:
   a plurality of photoreceiving portions provided in a substrate;
   an interlayer film overlying the plurality of photoreceiving portions;
   a large refractive index region respectively corresponding to each photoreceiving portion and having a higher refractive index than that of the interlayer film;

a plurality of wiring layers; and a layer provided between the plurality of photoreceiving portions and the large refractive index regions, the layer being provided under the plurality of wiring layers and having a lower etching rate than that of the interlayer film, wherein a refractive index of the layer of the lower etching rate is between the refractive index of each large refractive index region and a refractive index of the substrate, and the layer of the lower etching rate is arranged so as to cover at least a whole surface of the photoreceiving portions.

2. The photoelectric conversion device according to claim 1, wherein the layer of the lower etching rate and each large refractive index region are formed of a silicon nitride film or a silicon oxynitride film.

3. The photoelectric conversion device according to claim 1, wherein the layer of the lower etching rate is formed so as to cover a wider area than an area covered by a corresponding large refraction index region.

4. The photoelectric conversion device according to claim 1, further comprising a contact portion for a connection, wherein the layer of the lower etching rate is not arranged around the contact portion.

5. The photoelectric conversion device according to claim 1, wherein each large refractive index region is formed by plasma CVD.

6. The photoelectric conversion device according to claim 1, wherein each large refractive index region is formed by filling the region with a large refractive index material and then flattening a surface thereof.

7. A photoelectric conversion device comprising:

a plurality of photoreceiving portions provided in a substrate;

a transfer transistor for transferring a signal charge of a photoreceiving portion;

an interlayer film overlying the plurality of photoreceiving portions;

a large refractive index region provided so as to correspond to a photoreceiving portion and having a higher refractive index than a corresponding interlayer film;

a plurality of wiring layers; and a layer provided between the plurality of photoreceiving portions and the large refractive index regions, the layer being provided under the plurality of wiring layers and having a lower etching rate than that of the interlayer film, wherein the layer of the lower etching rate is arranged so as to cover at least a whole surface of each photoreceiving portion, and to cover at least of a part of a gate electrode of the transistor.

8. The photoelectric conversion device according to claim 7, wherein a refractive index of the layer of the lower etching rate is between the refractive index of each large refractive index region and a refractive index of the substrate.

9. The photoelectric conversion device according to claim 7, wherein the layer of the lower etching rate and each large refractive index region are independently a silicon nitride film or an silicon oxynitride film.

10. The photoelectric conversion device according to claim 7, wherein the layer of the lower etching rate is formed so as to cover a wider area than an area covered by each large refractive index region.

11. The photoelectric conversion device according to claim 7, further comprising a contact portion for a connection, wherein the layer of the lower etching rate is not arranged around the contact portion.

12. The photoelectric conversion device according to claim 7, wherein each large refractive index region is formed by plasma CVD.

13. The photoelectric conversion device according to claim 7, wherein each large refractive index region is formed by filling the region with a large refractive index material and then flattening a surface thereof.

14. A photoelectric conversion device comprising:

a plurality of photoreceiving portions provided in a substrate;

an interlayer film overlying the plurality of photoreceiving portions;

a large refractive index region provided so as to correspond to each photoreceiving portion and having a higher refractive index than that of the interlayer film a plurality of wiring layers;

a layer provided between the plurality of photoreceiving portions and the large refractive index regions, the layer being provided under the plurality of wiring layers and having a lower etching rate than that of the interlayer film; and an element isolation region arranged between at least two of the plurality of photoreceiving portions, wherein the layer of the lower etching rate is arranged so as to cover at least a whole surface of the plurality of photoreceiving portions and to cover at least of a part of the element isolation region.

15. The photoelectric conversion device according to claim 14, further comprising a transfer transistor for transferring a signal charge of a photoreceiving portion is arranged therein, wherein the layer of the lower etching rate is arranged on a whole surface of the substrate so as to cover a gate electrode of the transistor.

16. The photoelectric conversion device according to claim 1, wherein each large refractive index region is arranged to be in contact with the layer having the lower etching rate.

17. The photoelectric conversion device according to claim 7, wherein each large refractive index region is arranged to be in contact with the layer having the lower etching rate.

18. The photoelectric conversion device according to claim 14, wherein each large refractive index region is arranged to be in contact with the layer having the lower etching rate.

* * * * *